(12) United States Patent
Takamine

(10) Patent No.: US 10,476,470 B2
(45) Date of Patent: Nov. 12, 2019

(54) ELASTIC WAVE FILTER DEVICE

(71) Applicant: Murata Manufacturing Co., Ltd., Nagaokakyo-shi, Kyoto-fu (JP)

(72) Inventor: Yuichi Takamine, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 33 days.

(21) Appl. No.: 15/830,018

(22) Filed: Dec. 4, 2017

(65) Prior Publication Data
US 2018/0102755 A1 Apr. 12, 2018

Related U.S. Application Data

(63) Continuation of application No. PCT/JP2016/058559, filed on Mar. 17, 2016.

(30) Foreign Application Priority Data

Jun. 22, 2015 (JP) .................. 2015-124999

(51) Int. Cl.
*H03H 9/02* (2006.01)
*H03H 9/64* (2006.01)
(Continued)

(52) U.S. Cl.
CPC ..... *H03H 9/02086* (2013.01); *H01L 41/0805* (2013.01); *H01L 41/18* (2013.01);
(Continued)

(58) Field of Classification Search
CPC ........... H03H 9/02086; H03H 9/14594; H03H 9/568; H03H 9/6483; H03H 9/13;
(Continued)

(56) References Cited

U.S. PATENT DOCUMENTS

2001/0008387 A1* 7/2001 Taniguchi ............ H03H 9/6483
333/193
2007/0090898 A1* 4/2007 Kando ................. H03H 9/0222
333/195
(Continued)

FOREIGN PATENT DOCUMENTS

JP 2000-286663 A 10/2000
JP 2006-157174 A 6/2006
(Continued)

OTHER PUBLICATIONS

Official Communication issued in International Patent Application No. PCT/JP2016/058559, dated Jun. 7, 2016.

*Primary Examiner* — Robert J Pascal
*Assistant Examiner* — Jorge L Salazar, Jr.
(74) *Attorney, Agent, or Firm* — Keating & Bennett, LLP

(57) ABSTRACT

An elastic wave filter device includes a piezoelectric film, a high acoustic velocity support substrate in which an acoustic velocity of a propagating bulk wave is larger than an acoustic velocity of a main mode elastic wave propagating in the piezoelectric film, and IDT electrodes in contact with the piezoelectric film. A serial arm resonator and a parallel arm resonator are defined by the IDT electrodes such that, a direction in which tips of first and second electrode fingers are connected defines a tilt angle with respect to a propagation direction of elastic waves excited by the IDT electrodes. A tilt angle of the serial arm resonator is different from a tilt angle of the parallel arm resonator.

18 Claims, 9 Drawing Sheets

(51) Int. Cl.
*H01L 41/08* (2006.01)
*H01L 41/18* (2006.01)
*H03H 9/13* (2006.01)
*H03H 9/56* (2006.01)
*H03H 9/145* (2006.01)
*H03H 9/72* (2006.01)

(52) U.S. Cl.
CPC .......... *H03H 9/02574* (2013.01); *H03H 9/13* (2013.01); *H03H 9/14594* (2013.01); *H03H 9/568* (2013.01); *H03H 9/6436* (2013.01); *H03H 9/6483* (2013.01); *H03H 9/6496* (2013.01); *H03H 9/725* (2013.01)

(58) Field of Classification Search
CPC .... H03H 9/725; H03H 9/6496; H03H 9/6436; H03H 9/02574; H01L 41/0805; H01L 41/18
USPC .......................................... 333/133, 193–196
See application file for complete search history.

(56) References Cited

U.S. PATENT DOCUMENTS

| | | |
|---|---|---|
| 2012/0194032 A1 | 8/2012 | Kadota |
| 2013/0088305 A1 | 4/2013 | Takata |
| 2013/0099875 A1 | 4/2013 | Shimizu et al. |
| 2013/0229242 A1* | 9/2013 | Takata ................ H03H 9/6483 333/193 |
| 2013/0285768 A1 | 10/2013 | Watanabe et al. |
| 2014/0145557 A1 | 5/2014 | Tanaka |

FOREIGN PATENT DOCUMENTS

| | | |
|---|---|---|
| WO | 98/2279 A1 | 11/1998 |
| WO | 2011/046117 A1 | 4/2011 |
| WO | 2011/161987 A1 | 12/2011 |
| WO | 2012/086639 A1 | 6/2012 |
| WO | 2012/140831 A1 | 10/2012 |
| WO | 2013/002033 A1 | 1/2013 |

\* cited by examiner

ELASTIC WAVE FILTER DEVICE

CROSS REFERENCE TO RELATED APPLICATIONS

This application claims the benefit of priority to Japanese Patent Application No. 2015-124999 filed on Jun. 22, 2015 and is a Continuation Application of PCT Application No. PCT/JP2016/058559 filed on Mar. 17, 2016. The entire contents of each application are hereby incorporated herein by reference.

BACKGROUND OF THE INVENTION

1. Field of the Invention

The present invention relates to an elastic wave filter device using a piezoelectric film.

2. Description of the Related Art

An elastic wave device in which a low acoustic velocity film and a piezoelectric thin film are laminated on a high acoustic velocity film is disclosed in WO 2012/086639. A filter device including a tilted type interdigital transducer (IDT) is disclosed in Japanese Unexamined Patent Application Publication No. 2000-286663 cited below. In the tilted IDT, a line connecting tips of a plurality of first electrode fingers and a line connecting tips of a plurality of second electrode fingers are tilted in an oblique direction relative to an elastic wave propagation direction.

The elastic wave device described in WO 2012/086639 has a problem in that transverse mode ripples are generated. On the other hand, it is well-known that transverse modes are reduced or prevented by using the tilted IDT as described in Japanese Unexamined Patent Application Publication No. 2000-286663. Accordingly, it can be thought of that the transverse modes can be reduced or prevented by using the tilted IDT in the elastic wave device having a lamination structure described in WO 2012/086639. However, an elastic wave filter device including a plurality of IDTs has a problem in that sufficient steepness of the filter characteristics cannot be obtained in the case of using the tilted IDT.

SUMMARY OF THE INVENTION

Preferred embodiments of the present invention provide an elastic wave filter device capable of improving steepness of the filter characteristics.

An elastic wave filter device according to a preferred embodiment of the present invention includes a piezoelectric film; a high acoustic velocity member in which an acoustic velocity of a propagating bulk wave is larger than an acoustic velocity of a main mode elastic wave propagating in the piezoelectric film; the piezoelectric film made of a piezoelectric single crystal and laminated directly or indirectly on the high acoustic velocity member; and a plurality of IDT electrodes provided to be in contact with the piezoelectric film. The elastic wave filter device includes an input terminal, an output terminal, a serial arm connecting the input terminal and the output terminal, and a parallel arm connecting the serial arm and a ground potential; at least one serial arm resonator and at least one parallel arm resonator are defined by the plurality of IDT electrodes; the IDT electrodes of the at least one serial arm resonator and the at least one parallel arm resonator include a plurality of first electrode fingers and a plurality of second electrode fingers that are interdigitated with one another, and a direction in which tips of the plurality of first electrode fingers are connected and a direction in which tips of the plurality of second electrode fingers are connected are tilted to define a certain tilt angle ν with respect to a propagation direction ψ of elastic waves, being excited by the IDT electrodes, that is defined by Euler angles (φ, θ, ψ) of the piezoelectric single crystal; and, when the tilt angle of the at least one serial arm resonator is denoted as ν1 and the tilt angle of the at least one parallel arm resonator is denoted as ν2, the tilt angle ν1 differs from the tilt angle ν2.

In an elastic wave filter device according to a preferred embodiment of the present invention, the tilt angle ν1 is smaller than the tilt angle ν2. The Q-value becomes larger in a lower frequency region than the resonant frequency as the tilt angle is smaller. This makes it possible to improve the steepness on a lower frequency side of the pass band.

In an elastic wave filter device according to a preferred embodiment of the present invention, the tilt angle ν1 is preferably no less than about 2.5°, for example. In this case, transverse mode ripples are effectively reduced or prevented.

In an elastic wave filter device according to a preferred embodiment of the present invention, the tilt angle ν1 of all of the serial arm resonators is smaller than the tilt angle ν2 of all of the parallel arm resonators. In this case, the steepness on the lower frequency side of the pass band is more effectively improved.

In an elastic wave filter device according to a preferred embodiment of the present invention, the tilt angle ν1 is greater than the tilt angle ν2. The steepness on a higher frequency side of the pass band is improved because the Q-value becomes higher near the anti-resonance point as the tilt angle is larger.

In an elastic wave filter device according to a preferred embodiment of the present invention, the tilt angle ν2 is preferably no less than about 2.5°, for example. In this case, the transverse mode ripples are effectively reduced or prevented.

In an elastic wave filter device according to a preferred embodiment of the present invention, the tilt angle ν2 is preferably no more than about 9.0°, for example.

In an elastic wave filter device according to a preferred embodiment of the present invention, the tilt angle ν1 of all of the serial arm resonators is greater than the tilt angle ν2 of all of the parallel arm resonators. As such, the steepness on the higher frequency side of the pass band is more effectively improved.

In an elastic wave filter device according to a preferred embodiment of the present invention, the elastic wave filter device includes a first band pass filter having a relatively high pass band, and a second band pass filter having a lower pass band than the pass band of the first band pass filter; the first band pass filter includes the at least one serial arm resonator and the at least one parallel arm resonator. In this case, the steepness of filter characteristics of the first band pass filter is improved.

In an elastic wave filter device according to a preferred embodiment of the present invention, the elastic wave filter device includes a first band pass filter having a relatively high pass band, and a second band pass filter having a lower pass band than the pass band of the first band pass filter; the second band pass filter includes the at least one serial arm resonator and the at least one parallel arm resonator. In this case, the steepness of filter characteristics of the second band pass filter is improved.

In an elastic wave filter device according to a preferred embodiment of the present invention, the first band pass filter is a reception filter and the second band pass filter is a transmission filter, so as to define a duplexer.

In an elastic wave filter device according to a preferred embodiment of the present invention, the elastic wave filter device further includes a low acoustic velocity film which is laminated on the high acoustic velocity member and in which an acoustic velocity of a propagating bulk wave is smaller than an acoustic velocity of a main mode elastic wave propagating in the piezoelectric film, and the piezoelectric film is indirectly laminated on the high acoustic velocity member.

In an elastic wave filter device according to a preferred embodiment of the present invention, the piezoelectric film is directly laminated on the high acoustic velocity member.

In an elastic wave filter device according to a preferred embodiment of the present invention, a ladder filter is defined by the at least one serial arm resonator and the at least one parallel arm resonator.

In an elastic wave filter device according to a preferred embodiment of the present invention, the elastic wave filter device further includes a longitudinally coupled resonator elastic wave filter, and a ladder filter including the at least one serial arm resonator and the at least one parallel arm resonator is connected to the stated longitudinally coupled resonator elastic wave filter.

With the elastic wave filter devices according to various preferred embodiments of the present invention, the steepness on a lower frequency side or a higher frequency side of the pass band is improved.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Hereinafter, the present invention will be clarified by describing specific preferred embodiments of the present invention with reference to the drawings.

It is to be noted that the preferred embodiments described in the present specification are merely examples, and that configurations may be partially replaced or combined with each other between different preferred embodiments.

Figure 1:
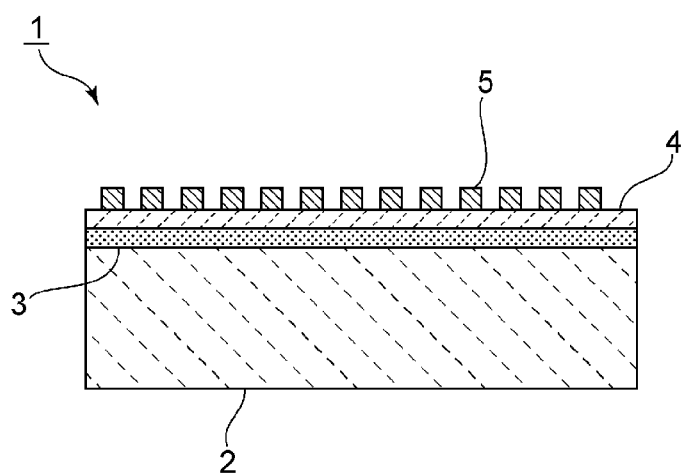
FIG. 1 is a front cross-sectional view for describing a lamination structure of an elastic wave resonator used in a first preferred embodiment of the present invention.

FIG. 1 is a front cross-sectional view for describing a lamination structure of an elastic wave resonator used in a first preferred embodiment of the present invention. An elastic wave resonator 1 includes a high acoustic velocity support substrate 2 as a high acoustic velocity member. A low acoustic velocity film 3 is provided on the high acoustic velocity support substrate 2.

A piezoelectric film 4 is laminated on a surface of the low acoustic velocity film 3 on the opposite side to a surface thereof at which the high acoustic velocity support substrate 2 is laminated. The piezoelectric film 4 is preferably made of a piezoelectric single crystal such as $LiTaO_3$, $LiNbO_3$, or other suitable material, for example. An IDT electrode 5 is provided on the piezoelectric film 4.

The acoustic velocity of a bulk wave is an acoustic velocity specific to each material. There exists a P wave that vibrates in a traveling direction of the wave, that is, in a longitudinal direction, and an S wave that vibrates in a transverse direction which is a direction perpendicular or substantially perpendicular to the traveling direction. The bulk wave propagates in any of the piezoelectric film, the high acoustic velocity member, and the low acoustic velocity film. In the case of an isotropic material, the P wave and the S wave exist. In the case of an anisotropic material, there exist the P wave, a slow S wave, and a fast S wave. In the case where a surface acoustic wave is excited using an anisotropic material, two S waves, that is, an SH (Shear Horizontal) wave and an SV (Shear Vertical) wave are generated. In the present specification, the acoustic velocity of a main mode elastic wave propagating in the piezoelectric film refers to, of the three modes of P wave, SH wave and SV wave, a mode that is used to obtain a pass band as a filter, resonance characteristics as a resonator, or the like.

In the high acoustic velocity support substrate 2, the acoustic velocity of the bulk wave propagating therein is preferably larger than the acoustic velocity of the main mode elastic wave propagating in the piezoelectric film 4. On the other hand, in the low acoustic velocity film 3, the acoustic velocity of the bulk wave propagating therein is preferably smaller than the acoustic velocity of the main mode elastic wave propagating in the piezoelectric film 4.

The high acoustic velocity support substrate 2 and the low acoustic velocity film 3 are made of appropriate materials satisfying the above-mentioned acoustic velocity relationship. As such materials, the following may preferably be used: piezoelectric materials, such as sapphire, lithium tantalate, lithium niobate, crystal and other suitable materials; dielectric materials, such as various types of ceramics including alumina, magnesia, silicon nitride, aluminum nitride, silicon carbide, zirconia, cordierite, mullite, steatite, forsterite and other suitable materials, glass, and other suitable materials; semiconductors, such as silicon, gallium nitride and other suitable materials; a resin substrate; and so on.

The high acoustic velocity support substrate 2 confines elastic waves in a section in which the piezoelectric film 4 and the low acoustic velocity film 3 are laminated.

Figure 14:
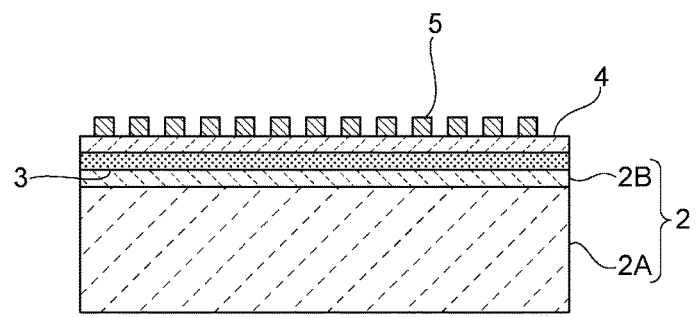
FIG. 14 is a front cross-sectional view for describing a variation on the lamination structure of the elastic wave resonator illustrated in FIG. 1.

In place of the high acoustic velocity support substrate 2, a high acoustic velocity member in which a high acoustic velocity film 2B is laminated on a support substrate 2A may be used, such as the variation illustrated in FIG. 14. The material used for the above-discussed high acoustic velocity support substrate 2 may appropriately be used for this support substrate 2A as well. Further, an appropriate material which is the above-discussed material of the high acoustic velocity support substrate and satisfies the above-discussed acoustic velocity relationship may be used also for the high acoustic velocity film 2B.

A close contact layer may preferably be provided between the high acoustic velocity member and the piezoelectric film 4. Forming the close contact layer makes it possible to improve adhesiveness between the high acoustic velocity member and the piezoelectric film 4. It is sufficient for the close contact layer to be resin, metal or other suitable material, and an epoxy resin, a polyimide resin, or other suitable resin may be used, for example.

Figure 15:
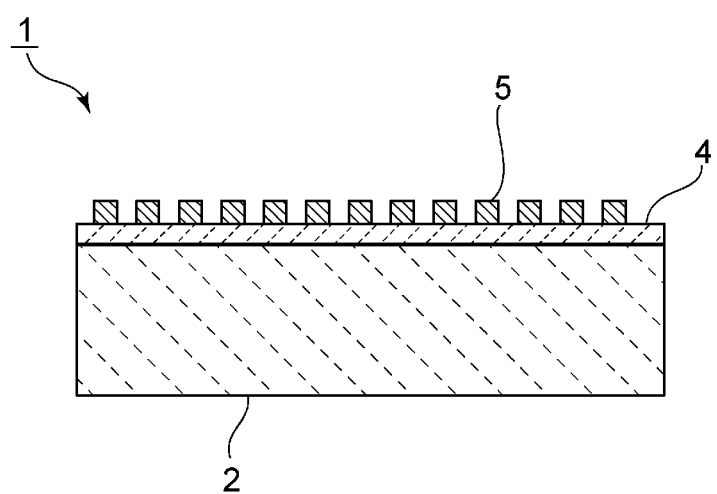
FIG. 15 is a front cross-sectional view for describing another variation on the lamination structure of the elastic wave resonator illustrated in FIG. 1.

Further, as in the variation illustrated in FIG. 15, the piezoelectric film 4 may preferably be directly laminated on the high acoustic velocity support substrate 2 as a high acoustic velocity member. In other words, the low acoustic velocity film 3 may be omitted. Also in this case, a high acoustic velocity member in which a high acoustic velocity film is laminated on a support substrate may be used as the high acoustic velocity member.

As discussed above, the piezoelectric film 4 may be directly laminated on the high acoustic velocity support substrate 2, or indirectly laminated thereon with the low acoustic velocity film 3 interposed therebetween.

The IDT electrode 5 is preferably made of an appropriate metal or alloy, for example.

The Q-value may be increased because the low acoustic velocity film 3 and the piezoelectric film 4 are laminated on the high acoustic velocity support substrate 2 in the elastic wave resonator 1.

An elastic wave filter device according to the first preferred embodiment of the present invention includes a plurality of the elastic wave resonators 1 having the laminated structure as illustrated in FIG. 1.

Figure 8:
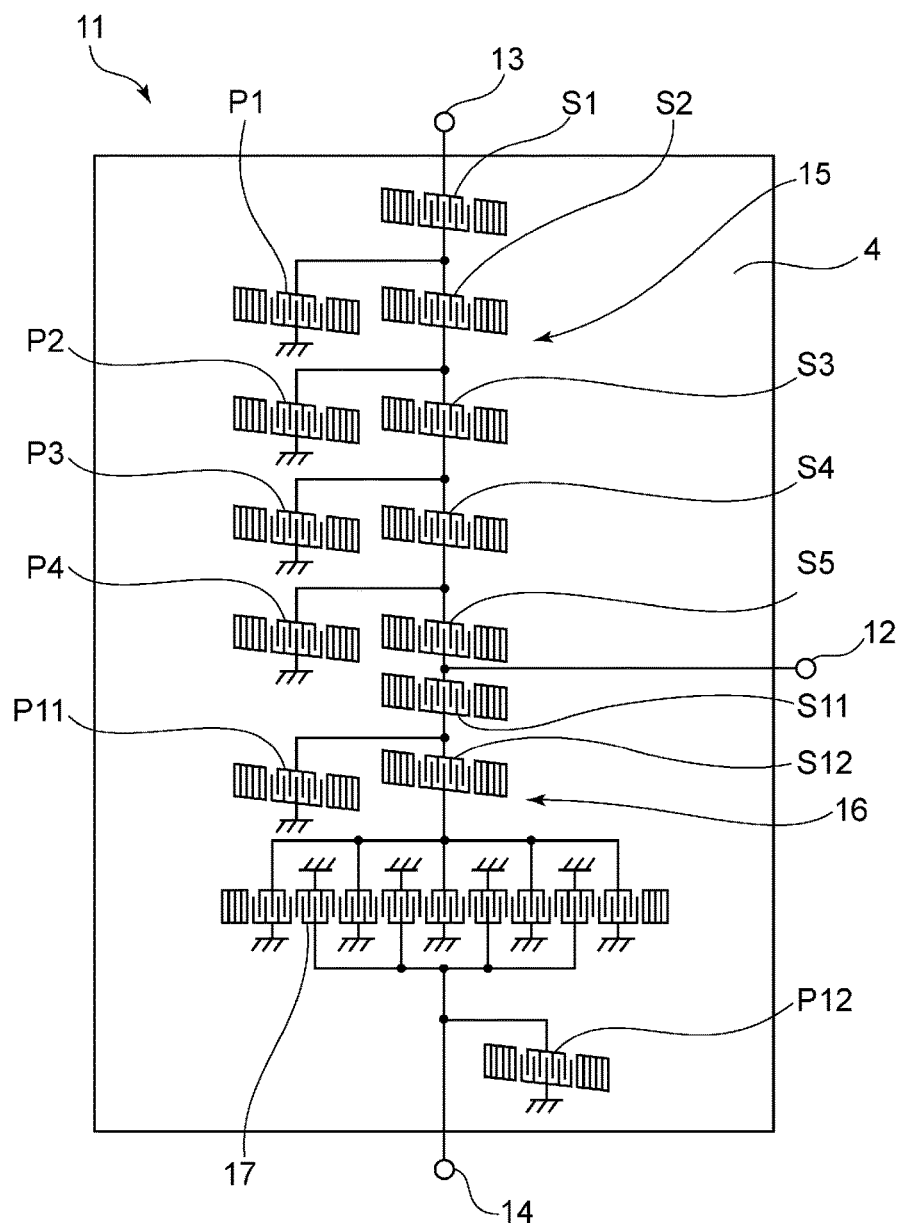
FIG. 8 is a plan view of an elastic wave filter device according to the first preferred embodiment of the present invention.
Figure 9:
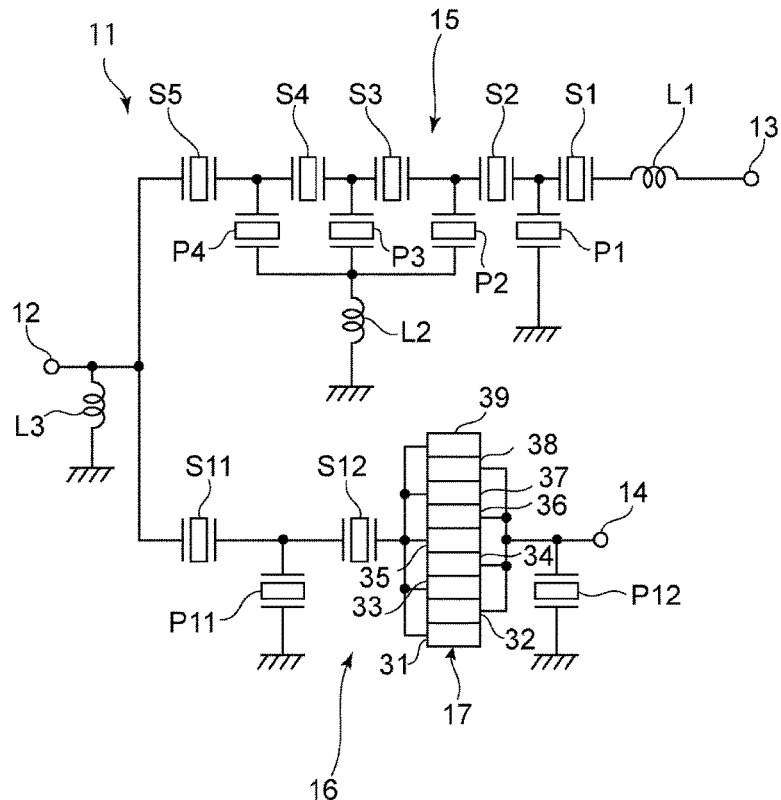
FIG. 9 is a circuit diagram of the elastic wave filter device according to the first preferred embodiment of the present invention.

FIG. 8 is a plan view of the elastic wave filter device according to the first preferred embodiment of the present invention, and FIG. 9 is a circuit diagram of the filter device.

An elastic wave filter device 11 illustrated in FIGS. 8 and 9 is preferably a duplexer used in the Band 25, for example.

As illustrated in FIG. 9, the elastic wave filter device 11 includes an antenna terminal 12, a transmission terminal 13, and a reception terminal 14. A transmission filter 15 is connected between the antenna terminal 12 and the transmission terminal 13. A reception filter 16 is connected between the antenna terminal 12 and the reception terminal 14. The transmission filter 15 is preferably a ladder filter, for example. The transmission filter 15 includes a plurality of serial arm resonators S1 to S5 and a plurality of parallel arm resonators P1 to P4. Each of the serial arm resonators S1 to S5 and the parallel arm resonators P1 to P4 is defined by an elastic wave resonator, and has the same or substantially the same laminated structure as the elastic wave resonator 1 illustrated in FIG. 1.

An inductor L1 is connected between the transmission terminal 13 and the serial arm resonator S1. Ground-side end portions of the parallel arm resonators P2 to P4 are commonly connected. An inductor L2 is connected between the ground-side end portions and a ground potential.

The reception filter 16 preferably includes a longitudinally coupled resonator elastic wave filter 17 of 9-IDT type, for example. The number of IDTs of the longitudinally coupled resonator elastic wave filter 17 is not limited to nine.

The longitudinally coupled resonator elastic wave filter 17 defines a pass band of the reception filter 16. In addition, in order to improve steepness of the pass band, a ladder filter including serial arm resonators S11 and S12 and a parallel arm resonator 11 is connected between the antenna terminal 12 and the longitudinally coupled resonator elastic wave filter 17. Further, a parallel arm resonator P12 is connected between the ground potential and a connection point between the longitudinally coupled resonator elastic wave filter 17 and the reception terminal 14. Each of the serial arm resonators S11 and S12 as well as the parallel arm resonators P11 and P12 may also have the same or substantially the same laminated structure as the elastic wave resonator 1.

Moreover, the longitudinally coupled resonator elastic wave filter 17 also has the same or substantially the same lamination structure as the elastic wave resonator 1. In other words, the elastic wave filter has a structure in which the low acoustic velocity film 3 and the piezoelectric film 4 are laminated on the high acoustic velocity support substrate 2.

An impedance matching inductor L3 is connected between the antenna terminal 12 and the ground potential.

As illustrated in FIG. 8, an electrode structure illustrated is provided on the piezoelectric film 4 in the elastic wave filter device 11. Although not illustrated in FIG. 8, the low acoustic velocity film 3 and the high acoustic velocity support substrate 2 are positioned under the piezoelectric film 4. The electrode structure illustrated in FIG. 8 preferably includes a single high acoustic velocity support substrate 2, the low acoustic velocity film 3, and the piezoelectric film 4 in the elastic wave filter device 11. Accordingly, the elastic wave filter device 11 preferably is a single chip component, for example. Note that, however, the transmission filter 15 and the reception filter 16 may be provided as different chip components, for example, in the elastic wave filter device 11.

Figure 2:
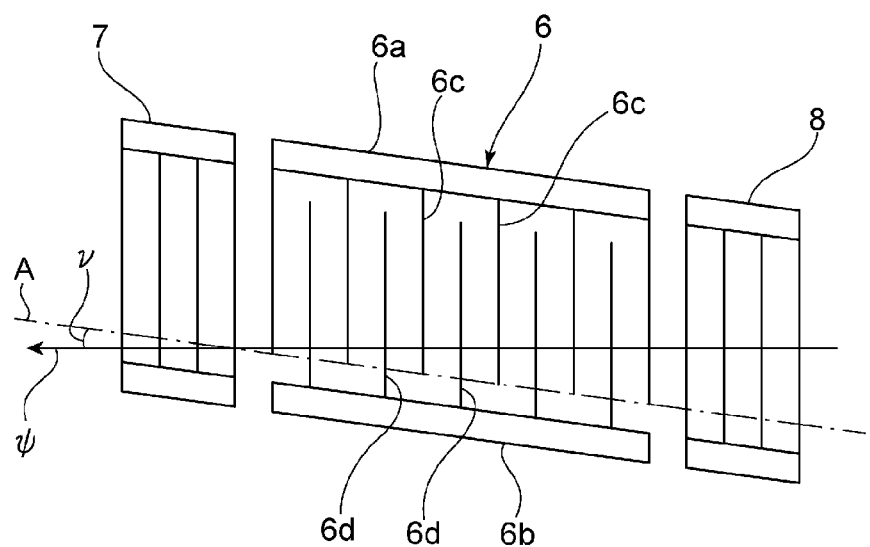
FIG. 2 is a plan view schematically illustrating an electrode structure of an elastic wave resonator for describing a tilted IDT used in the first preferred embodiment of the present invention.

In the present preferred embodiment, the serial arm resonators S1 to S5, the parallel arm resonators P1 to P4, the serial arm resonators S11 and S12, and the parallel arm resonators P11 and P12 preferably include tilted IDTs. FIG. 2 is a plan view schematically illustrating an electrode structure of an elastic wave resonator for describing the tilted IDT used in the first preferred embodiment.

As illustrated in FIG. 2, reflectors 7 and 8 are provided on both sides in an elastic wave propagation direction of an IDT electrode 6. The IDT electrode 6 includes a first busbar 6a and a second busbar 6b. One end of each of a plurality of first electrode fingers 6c is connected to the first busbar 6a. One end of each of a plurality of second electrode fingers 6d is connected to the second busbar 6b. The plurality of first electrode fingers 6c and the plurality of second electrode fingers 6d are interdigitated with one another.

An elastic wave propagation direction $\psi$ is defined by Euler angles $(\varphi, \theta, \psi)$ of a piezoelectric single crystal. The elastic wave propagation direction $\psi$ is a direction orthogonal or substantially orthogonal to a direction in which the plurality of first electrode fingers 6c and the plurality of second electrode fingers 6d extend. In the IDT electrode 6 as a tilted IDT, a direction A connecting tips of the plurality of first electrode fingers 6c is tilted in an oblique direction relative to the elastic wave propagation direction $\psi$. In other words, the direction A connecting the tips of the plurality of first electrode fingers 6c is tilted to define a tilt angle $\nu$ with respect to the elastic wave propagation direction $\psi$. A line connecting tips of the plurality of second electrode fingers 6d is also tilted to define the tilt angle $\nu$ with respect to the elastic wave propagation direction $\psi$.

The first and second busbars 6a and 6b are tilted to define a tilt angle $\nu$, which is the same or substantially the same as the above-discussed tilt angle $\nu$, with respect to the elastic wave propagation direction $\psi$.

With the elastic wave resonator using the tilted IDT, transverse mode ripples are effectively reduced or prevented. This will be explained below.

Figure 3:
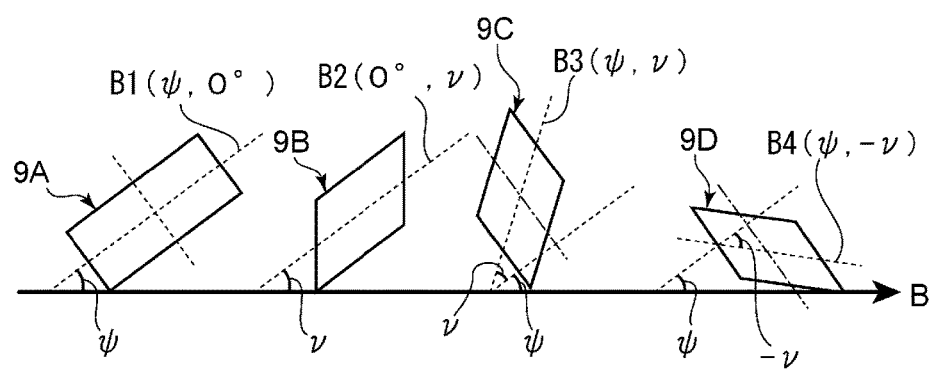
FIG. 3 is a schematic diagram for describing a relationship between a propagation direction ψ and a tilt angle ν.

FIG. 3 is a schematic diagram for describing a relationship between the propagation direction $\psi$ and the tilt angle $\nu$. It is assumed that LiTaO$_3$ has Euler angles $(\varphi, \theta, \psi)$. A direction indicated by an arrow B in FIG. 3 is a direction of $\psi=0°$. Broken lines B1 to B4 in IDT electrodes 9A to 9D each indicate a direction parallel or substantially parallel to a direction in which tips of a plurality of first electrode fingers in each of the IDT electrodes 9A to 9D are connected to each other. In the IDT electrode 9A, the direction of the broken line B1 and the propagation direction $\psi$ in which the elastic wave propagates are the same. As such, in this case, when the direction of each broken line is expressed as (elastic wave propagation direction, tilt angle $\nu$ with respect to the propagation direction), the direction of the broken line B1 is expressed as $(\psi, 0°)$. In the case of the IDT electrode 9B, the direction is expressed as $(0°, \nu)$. In the case of the IDT electrode 9C, the direction is expressed as $(\psi, \nu)$. In the case of the IDT electrode 9D, the direction is expressed as $(\psi, -\nu)$.

In the present specification, an angle between the elastic wave propagation direction and the direction in which the tips of the electrode fingers are connected is denoted as the tilt angle $\nu$.

Characteristics of an elastic wave resonator including a tilted IDT will be described next.

Design parameters of the elastic wave resonator were set as follows, for example.

Piezoelectric thin film: Y-cut LiTaO$_3$ film with a cut angle of about 55°

Electrode finger intersecting width of IDT electrode=about 15λ

Number of pairs of electrode fingers=83 pairs

λ=about 2 μm, where λ is a wave length determined by the electrode finger pitch.

Offset length L to be explained later=about 2λ

IDT electrode duty=about 0.6

IDT electrode film thickness=about 0.08λ

Film thickness of LiTaO$_3$ film=about 0.3λ

Film thickness of silicon oxide film constituting a joint member layer=about 0.35λ

Gap dimension G=about 0.5 μm

In accordance with the above design parameters, an elastic wave resonator of a comparative example 1 in which the tilt angle $\nu$ was set to be about 0 degree was manufactured.

Figure 4:
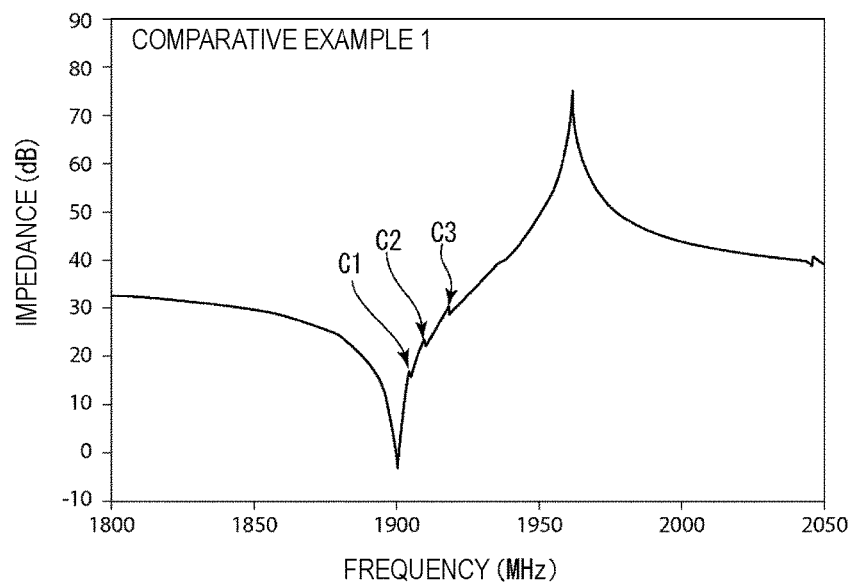
FIG. 4 is a graph showing impedance characteristics of an elastic wave resonator of a comparative example 1 in which the tilt angle ν is 0 degree.
Figure 6:
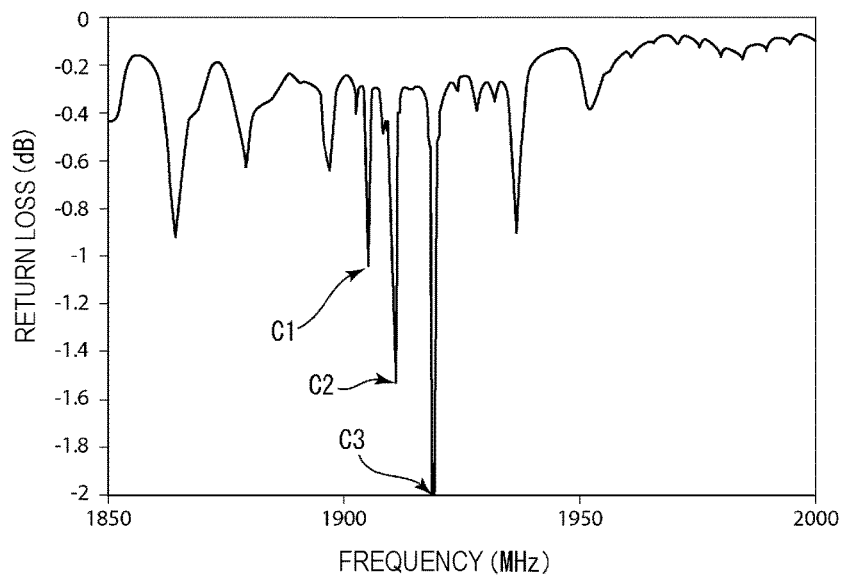
FIG. 6 is a graph showing return loss characteristics of the elastic wave resonator of the comparative example 1 in which the tilt angle ν is 0 degree.

FIG. 4 is a graph showing impedance characteristics of the elastic wave resonator of the comparative example 1. FIG. 6 shows return loss characteristics of the elastic wave resonator of the comparative example 1. The tilt angle $\nu$ was set to be about 0 degree in the elastic wave resonator of the comparative example 1. In other words, the propagation direction $\psi$ was made to be the same or substantially the same as a surface acoustic wave propagation direction.

Further, in the same or similar manner as the comparative example 1, elastic wave resonators in which the tilt angles $\nu$ of the IDT electrodes were respectively set to be about 2.5°, about 5.0°, about 7.5°, about 10°, and about 15° were manufactured.

Figure 5:
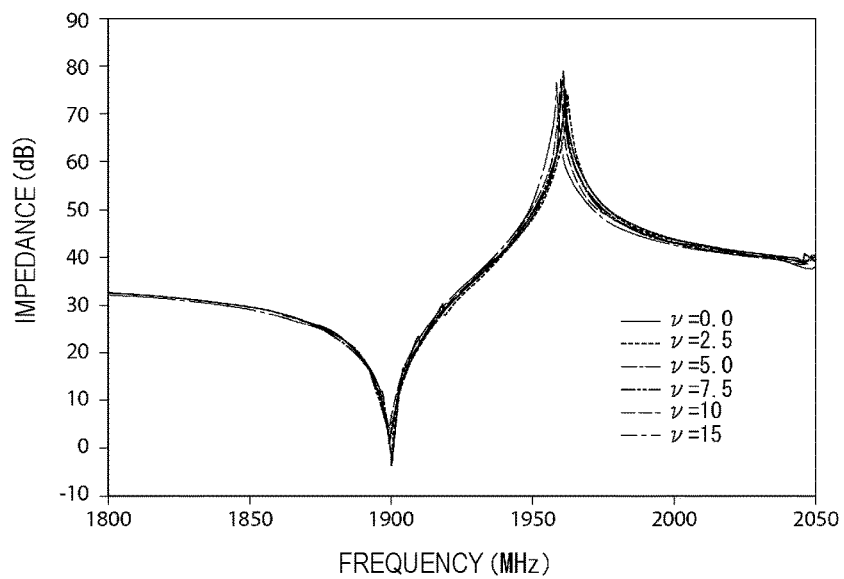
FIG. 5 is a graph showing a change in impedance characteristics of an elastic wave resonator in the case where the tilt angle ν is changed.
Figure 7:
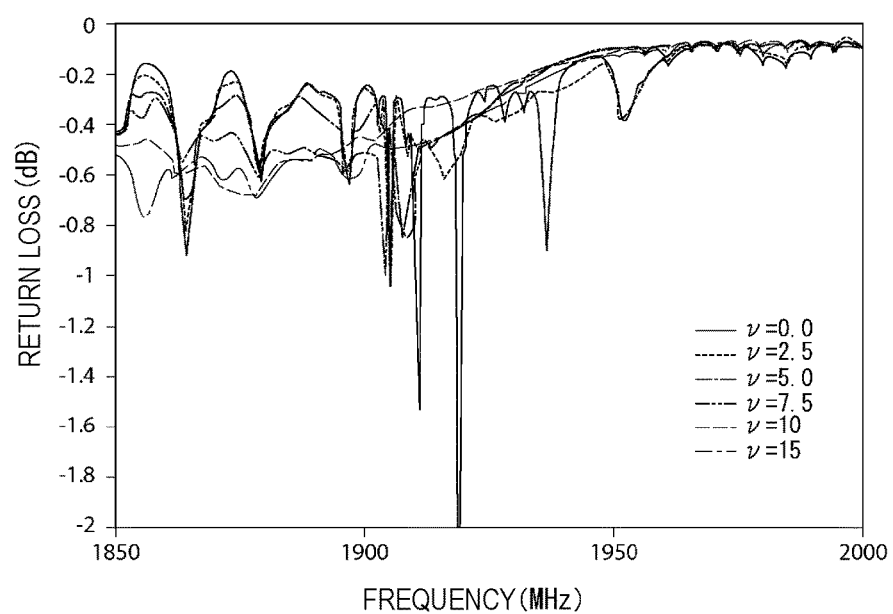
FIG. 7 is a graph showing a change in return loss characteristics of an elastic wave resonator in the case where the tilt angle ν is changed.

Impedance characteristics of these elastic wave resonators are shown in FIG. 5, and return loss characteristics thereof are shown in FIG. 7.

As is clear from FIG. 4, in the comparative example 1 where the tilt angle $\nu$ is about 0 degree, it is understood that ripples indicated by arrows C1 to C3 appear between the resonant frequency and the anti-resonant frequency. Further, arrows C1 to C3 in FIG. 6 indicate ripples corresponding to the ripples indicated by C1 to C3 in FIG. 4.

Although not necessarily clear in FIG. 5, it is understood that, according to the return loss characteristics of FIG. 7, the transverse mode ripples are reduced or prevented when $\nu$ is no less than about 2.5°, for example.

As is clear from FIG. 7, it is understood that the transverse mode ripples are effectively reduced or prevented when $\nu$ is no less than about 2.5°, in comparison with the suppression when $\nu$ being about 0 degree.

As described thus far, with the elastic wave resonator using the tilted IDT, transverse mode ripples are reduced or prevented.

Returning to FIG. 8, in the elastic wave filter device 11, the serial arm resonators S1 to S5, the parallel arm resonators P1 to P4, the serial arm resonators S11 and S12, and the parallel arm resonators P11 and P12 are preferably each the elastic wave resonator including the tilted IDT. This makes it possible to increase the Q-value.

In addition, in the elastic wave filter device 11, the tilt angle of the parallel arm resonator P11 in the reception filter 16 is set to be relatively large in comparison with the tilt angle of the serial arm resonators S1 to S5 and the parallel arm resonators P1 to P4 used in the transmission filter 15 and the tilt angle of the serial arm resonators S11 and S12 used in the reception filter 16. The tilt angle of the serial arm resonators S1 to S5, the parallel arm resonators P1 to P4, and the serial arm resonators S11 and S12 is denoted as v1. Then, the tilt angle of the parallel arm resonator P11 is denoted as v2. Because v1 is smaller than v2, steepness of the pass band on the lower frequency side is improved in the reception filter 16. This will be more specifically described below.

The low acoustic velocity film 3 preferably made of about 670 nm-thick $SiO_2$ was laminated on the high acoustic velocity support substrate 2 preferably with a thickness of about 200 μm, for example. The piezoelectric film 4 made of about 600 nm-thick $LiTaO_3$ with a cut angle of about 50° was laminated on the low acoustic velocity film 3. An electrode structure including the IDT electrode was provided on the piezoelectric film 4, and the elastic wave filter device 11 was thus obtained.

At the time of providing the electrode structure, preferably, an Al—Cu alloy film including about 1 wt. % of Cu, for example, was provided with a thickness of about 162 nm on a Ti film having a thickness of about 12 nm, for example. Further, a $SiO_2$ film having a thickness of about 25 nm, for example, was preferably provided at the uppermost portion as a protection film. Design parameters of IDT electrodes 31 to 39 of the longitudinally coupled resonator elastic wave filter 17, and design parameters of the serial arm resonators S11 and S12 as well as the parallel arm resonators P11 and P12 on the reception filter 16 side were set as shown in Table 1 and Table 2 below.

Design parameters of the serial arm resonators S1 to S5 and the parallel arm resonators P1 to P4 were set as shown in Table 3 below.

TABLE 1

| | Wave length (μm) | Number of pairs of IDTs, electrode fingers |
|---|---|---|
| Reflector | 1.9771 | — |
| IDT 31, 39 main | 1.9859 | 20.5 |
| IDT 31, 39 narrow-pitch | 1.7949 | 1.5 |
| IDT 32, 38 narrow-pitch (IDT 31, 39 side) | 1.8187 | 1.0 |
| IDT 32, 38 main | 1.9290 | 12.5 |
| IDT 32, 38 narrow-pitch (IDT 33, 37 side) | 1.8587 | 3.5 |
| IDT 33, 37 narrow-pitch (IDT 32, 38 side) | 1.8789 | 4.0 |
| IDT 33, 37 main | 1.9639 | 17.0 |
| IDT 33, 37 narrow-pitch (IDT 34, 36 side) | 1.8795 | 4.0 |
| IDT 34, 36 narrow-pitch (IDT 33, 37 side) | 1.8579 | 3.5 |
| IDT 34, 36 main | 1.9253 | 12.5 |
| IDT 34, 36 narrow-pitch (IDT 35 side) | 1.8253 | 1.0 |
| IDT 35 narrow-pitch | 1.8023 | 1.5 |
| IDT 35 main | 1.9791 | 33.0 |

In Table 1, the term "narrow-pitch" means a narrow-pitch electrode finger portion. The term "main" means remaining electrode finger portions other than the narrow-pitch electrode finger portion. The duty of the IDT electrodes 31 to 39 in the longitudinally coupled resonator elastic wave filter 17 and the duty of the reflectors were both set to about 0.5, for example. Intervals between the reflectors and the IDT electrodes 31, 39 were set to about 0.534, for example, when a wave length determined by the electrode finger pitch of the reflector was taken as $\lambda_R$. The number of electrode fingers of the reflector was 30. The electrode finger intersecting width of the IDT electrodes 31 to 39 was about 23 μm, for example.

TABLE 2

| | Elastic wave resonator | | | |
|---|---|---|---|---|
| | S11 | P11 | S12 | P12 |
| IDT wave length (μm) | 1.901 | 1.9707 | 1.8857 | 1.9629 |
| Reflector wave length (μm) | Same as IDT | Same as IDT | Same as IDT | Same as IDT |
| Intersecting width (μm) | 15.3 | 42 | 27.8 | 20 |
| Number of pairs of IDTs, electrode fingers | 70 | 68 | 229 | 62 |
| Number of electrode fingers of reflector | 31 | 31 | 31 | 31 |
| Duty | 0.5 | 0.5 | 0.5 | 0.5 |

TABLE 3

| | S1 | P1 | S2 | P2 | S3 | P3 | S4 | P4 | S5 |
|---|---|---|---|---|---|---|---|---|---|
| IDT wave length (μm) | 1.9926 | 2.0871 | 2.0163 | 2.1042 | 2.0142 | 2.0881 | 2.0167 | 2.0875 | 2.0043 |
| Reflector wave length (μm) | Same as IDT | Same as IDT | Same as IDT | Same as IDT | Same as IDT | Same as IDT | Same as IDT | Same as IDT | Same as IDT |
| Intersecting width (μm) | 17.3 | 60.2 | 30 | 75.7 | 25 | 30.6 | 30.5 | 49.2 | 25 |
| Number of pairs of IDTs, electrode fingers | 140 | 77 | 147 | 38 | 94 | 108 | 107 | 113 | 98 |
| Number of electrode fingers of reflector | 21 | 21 | 21 | 21 | 21 | 21 | 21 | 21 | 21 |
| Duty | 0.5 | 0.5 | 0.5 | 0.5 | 0.5 | 0.5 | 0.5 | 0.5 | 0.5 |

Then, in an elastic wave filter device of a working example, the tilt angle v1 was set to about 5.0° and the tilt angle v2 was set to about 7.5°, for example.

As a comparative example 2, an elastic wave filter device was manufactured in the same or substantially the same manner as the elastic wave filter device of the working example except that the tilt angles v1 and v2 were all set to about 7.5°, for example.

Figure 10:
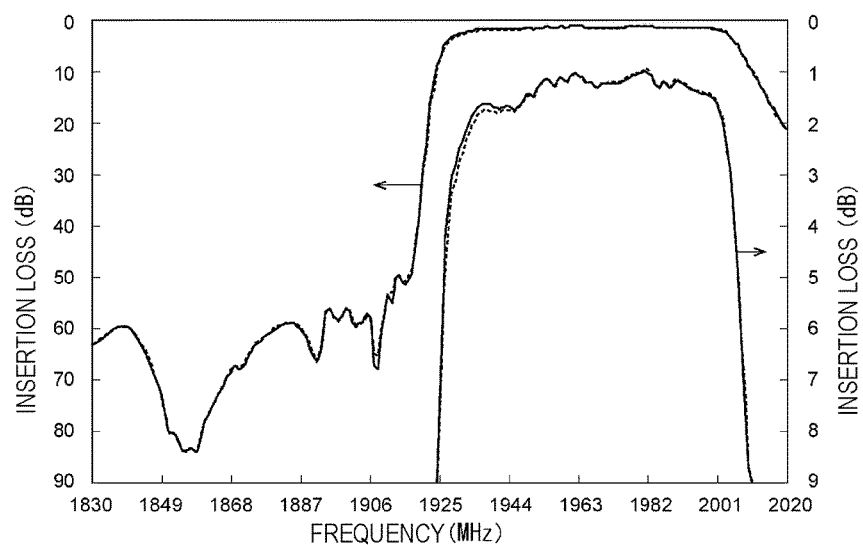
FIG. 10 is a graph showing attenuation frequency characteristics of a working example of the elastic wave filter device according to the first preferred embodiment of the present invention and attenuation frequency characteristics of an elastic wave filter device as a comparative example 2 prepared for comparison.

FIG. 10 is a graph in which a solid line indicates attenuation frequency characteristics of the reception filter in the elastic wave filter device of the working example. A broken line therein indicates attenuation frequency characteristics of the reception filter in the elastic wave filter device of the comparative example 2.

As is clear from FIG. 10, according to the working example, steepness in the pass band on a lower frequency side is improved in comparison with the comparative example 2. For example, steepness of the pass band, in which insertion loss is about 3 dB and isolation is about 55 dB, is improved by approximately 1.0 MHz on the lower frequency side in the working example in comparison with the comparative example 2.

The reason that the steepness of the pass band on the lower frequency side is improved in the working example as discussed above, will be described below with reference to FIGS. 11 to 13.

Figure 11:
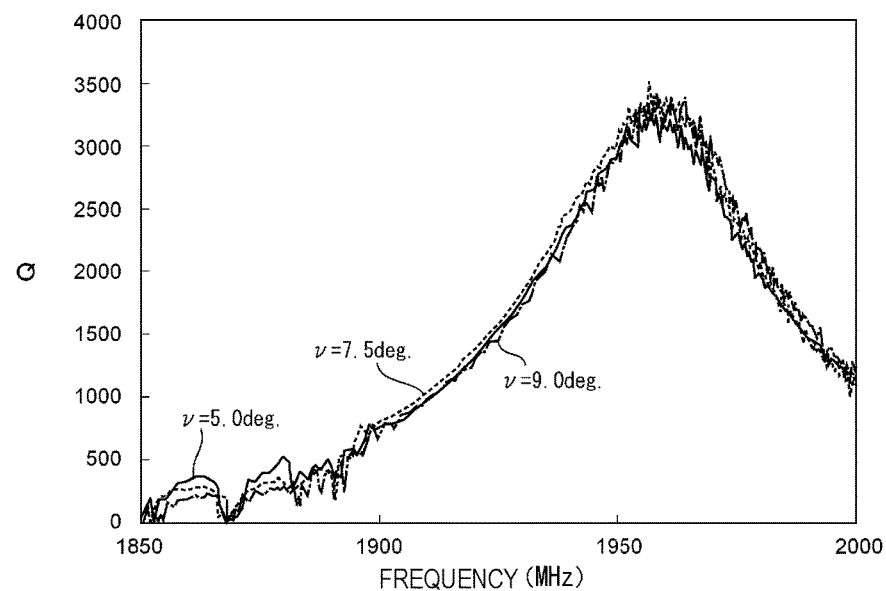
FIG. 11 is a graph showing a change in the Q-value in the case where the tilt angle ν of an elastic wave resonator is changed to about 5.0°, about 7.5°, and about 9.0°.
Figure 12:
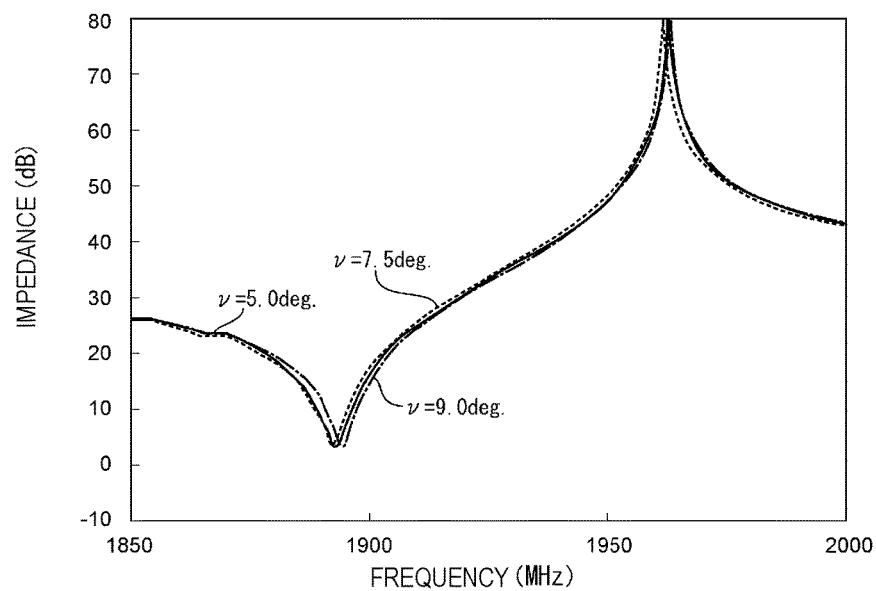
FIG. 12 is a graph showing a change in impedance Z in the case where the tilt angle ν of an elastic wave resonator is changed to about 5.0°, about 7.5°, and about 9.0°.

FIG. 11 is a graph showing a change in the Q-value in the case in which the tilt angle v of an elastic wave resonator including the tilted IDT is changed to about 5.0°, about 7.5°, and about 9.0°. FIG. 12 is a graph showing a change in impedance Z.

Figure 13:
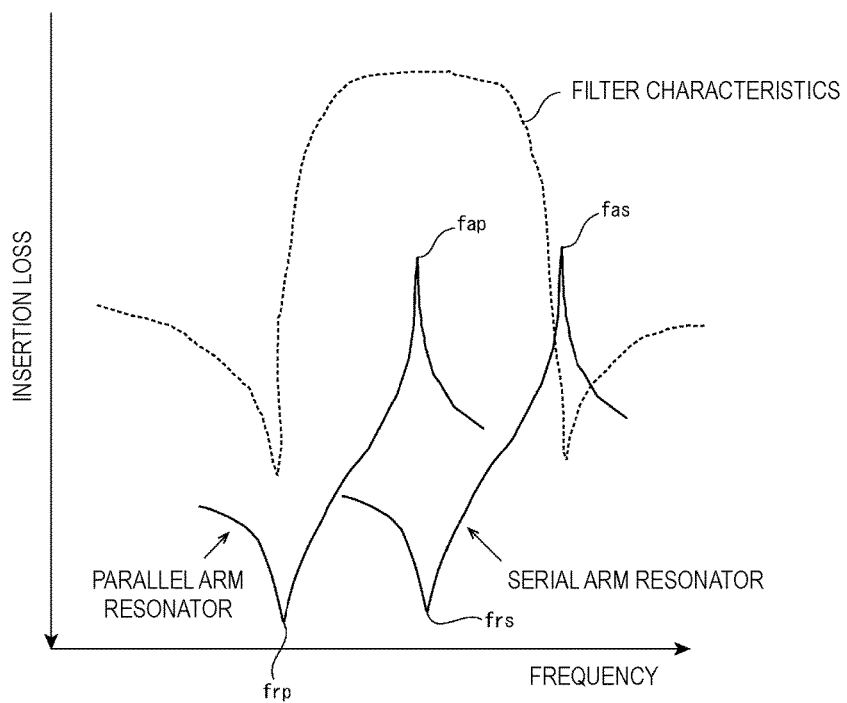
FIG. 13 is a schematic graph for describing the enhancement of steepness in the elastic wave filter device of the first preferred embodiment of the present invention.

Further, FIG. 13 is a schematic graph for describing the improvement of steepness of filter characteristics in the elastic wave filter device of the first preferred embodiment.

As shown in FIG. 11, the Q-value is increased to be higher on a lower frequency side relative to the resonance point as the tilt angle v is reduced.

In contrast, it is understood that, near the anti-resonance point, the Q-value is smaller when the tilt angle v is about 5.0° than the Q-value when the tilt angle v is about 7.5° or about 9.0°.

In a ladder filter, as shown in FIG. 13, filter characteristics indicated by a broken line are obtained by combining impedance characteristics of the parallel arm resonator and impedance characteristics of the serial arm resonator. A resonance point frs and an anti-resonance point fas of the serial arm resonator are positioned as shown in the graph. Here, the resonance point frs of the serial arm resonator is positioned within the pass band. Accordingly, a frequency band necessary to improve its steepness on the lower frequency side of the pass band is a frequency region lower than the resonance point frs of the serial arm resonator. As such, it is preferable in the serial arm resonator that the Q-value be high on a lower frequency side than the resonance point frs. Accordingly, it is preferable for the tilt angle v to be small.

Meanwhile, in the parallel arm resonator, a resonance point frp is positioned on the lower frequency side of the pass band, and an anti-resonance point fap is positioned within the pass band of the filter. Accordingly, as the tilt angle v is reduced, insertion loss of the filter characteristics is worsened. Therefore, in the present preferred embodiment, the tilt angle v1 of the serial arm resonators S11 and S12 of the reception filter is preferably set to be smaller than the tilt angle v2 of the parallel arm resonator P11. This makes it possible to improve the steepness of the pass band on the lower frequency side without causing degradation in the insertion loss within the pass band of the reception filter 16 including the ladder filter.

Although, in the present preferred embodiment, v2 is preferably larger than v1, v1 may be larger than v2. In this case, the Q-value of the serial arm resonator is increased near the anti-resonance point. As such, the steepness on a higher frequency side of the pass band is improved.

Further, as discussed above, it is preferable that the tilt angle v of the tilted IDT be no less than about 2.5°, for example. With this, transverse mode ripples are effectively reduced or prevented. Accordingly, in the case in which v2 is greater than v1, it is preferable that v1 be no less than about 2.5°, for example. Meanwhile, in the case where v1 is greater than v2, it is preferable that v2 be no less than about 2.5°, for example.

In preferred embodiments of the present invention, the tilt angle v1 is preferably smaller than the tilt angle v2 in the reception filter 16; also in the transmission filter 15, v1 may be smaller than v2 or v1 may be greater than v2, where v1 is the tilt angle of the serial arm resonators S1 to S5 and v2 is the tilt angle of the parallel arm resonators P1 to P4. In other words, in the ladder circuit including the serial arm resonators and the parallel arm resonators, it is sufficient to make the tilt angle v1 different from the tilt angle v2 by using the tilted IDTs. This makes it possible to improve the steepness on a lower frequency side or on a higher frequency side of the pass band.

Further, in preferred embodiments of the present invention, although the tilt angle of the serial arm resonators S11 and S12 is denoted as v1, only the tilt angle of one of the serial arm resonators S11 and S12 may be denoted as v1. That is to say, in at least one serial arm resonator and at least one parallel arm resonator defining the ladder circuit, it is sufficient that the tilt angle v1 of the at least one serial arm resonator differs from the tilt angle v2 of the at least one parallel arm resonator.

The reception filter may be defined by only the ladder filter without using the longitudinally coupled resonator elastic wave filter 17 as in the above preferred embodiments.

In preferred embodiments of the present invention, the tilt angle v1 and the tilt angle v2 preferably are different from each other in the reception filter as the first band pass filter having a relatively high band pass. On the other hand, as described above, at the transmission filter 15 side, that is, in the transmission filter 15 as the second band pass filter having a relatively low band pass, the tilt angle v1 and the tilt angle v2 may preferably be different from each other. In this case, v1 may be greater than v2 or v2 may be greater than v1.

Further, as in the above preferred embodiment, it is preferable that the tilt angle v1 of all of the serial arm resonators be smaller than the tilt angle v2 of all of the parallel arm resonators. With this configuration, the steepness of the filter characteristics on the lower frequency side of the pass band is more effectively improved. Furthermore, it is preferable that the tilt angle v1 of all of the serial arm resonators be greater than the tilt angle v2 of all of the parallel arm resonators. With this, the steepness of the filter characteristics on the higher frequency side of the pass band is more effectively improved.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An elastic wave filter device comprising:
a piezoelectric film including:
a high acoustic velocity member in which an acoustic velocity of a propagating bulk wave is larger than an acoustic velocity of a main mode elastic wave propagating in the piezoelectric film;
the piezoelectric film being made of a piezoelectric single crystal and laminated directly or indirectly on the high acoustic velocity member; and
a plurality of IDT electrodes in contact with the piezoelectric film; wherein
the elastic wave filter device includes an input terminal, an output terminal, a serial arm connecting the input terminal and the output terminal, and a parallel arm connecting the serial arm and a ground potential;
at least one serial arm resonator and at least one parallel arm resonator are defined by the plurality of IDT electrodes;
the plurality of IDT electrodes defining the at least one serial arm resonator and the at least one parallel arm resonator include a plurality of first electrode fingers and a plurality of second electrode fingers that are interdigitated with one another, and a direction in which tips of the plurality of first electrode fingers are connected and a direction in which tips of the plurality of second electrode fingers are connected are tilted to define a tilt angle $v$ with respect to a propagation direction $\psi$ of elastic waves being excited by the IDT electrodes, that is defined by Euler angles ($\varphi$, $\theta$, $\psi$) of the piezoelectric single crystal; and
when the tilt angle of the at least one serial arm resonator is denoted as $v1$ and the tilt angle of the at least one parallel arm resonator is denoted as $v2$, the tilt angle $v1$ differs from the tilt angle $v2$.

2. The elastic wave filter device according to claim 1, wherein the tilt angle $v1$ is smaller than the tilt angle $v2$.

3. The elastic wave filter device according to claim 2, wherein the tilt angle $v1$ is not less than about 2.5°.

4. The elastic wave filter device according to claim 2, wherein the tilt angle $v1$ of all of the serial arm resonators is smaller than the tilt angle $v2$ of all of the parallel arm resonators.

5. The elastic wave filter device according to claim 2, further comprising:
a first band pass filter with a relatively high pass band; and
a second band pass filter with a lower pass band than the pass band of the first band pass filter; wherein
the first band pass filter includes the at least one serial arm resonator and the at least one parallel arm resonator.

6. The elastic wave filter device according to claim 5, wherein the first band pass filter is a reception filter, the second band pass filter is a transmission filter, and a duplexer is defined by the first and second band pass filters.

7. The elastic wave filter device according to claim 2, further comprising:
a first band pass filter with a relatively high pass band; and
a second band pass filter with a lower pass band than the pass band of the first band pass filter; wherein
the second band pass filter includes the at least one serial arm resonator and the at least one parallel arm resonator.

8. The elastic wave filter device according to claim 7, wherein the first band pass filter is a reception filter, the second band pass filter is a transmission filter, and a duplexer is defined by the first and second band pass filters.

9. The elastic wave filter device according to claim 1, wherein the tilt angle $v1$ is greater than the tilt angle $v2$.

10. The elastic wave filter device according to claim 9, wherein the tilt angle $v2$ is not less than about 2.5°.

11. The elastic wave filter device according to claim 10, wherein the tilt angle $v2$ is not more than about 9.0°.

12. The elastic wave filter device according to claim 9, wherein the tilt angle $v1$ of all of the serial arm resonators is greater than the tilt angle $v2$ of all of the parallel arm resonators.

13. The elastic wave filter device according to claim 1, further comprising:
a low acoustic velocity film which is laminated on the high acoustic velocity member, and in which an acoustic velocity of a propagating bulk wave is smaller than an acoustic velocity of a main mode elastic wave propagating in the piezoelectric film; wherein
the piezoelectric film is indirectly laminated on the high acoustic velocity member.

14. The elastic wave filter device according to claim 1, wherein the piezoelectric film is directly laminated on the high acoustic velocity member.

15. The elastic wave filter device according to claim 1, wherein a ladder filter is defined by the at least one serial arm resonator and the at least one parallel arm resonator.

16. The elastic wave filter device according to claim 1, further comprising:
a longitudinally coupled resonator elastic wave filter; wherein
a ladder filter including the at least one serial arm resonator and the at least one parallel arm resonator is connected to the longitudinally coupled resonator elastic wave filter.

17. The elastic wave filter device according to claim 1, wherein the piezoelectric single crystal is $LiTaO_3$ or $LiNbO_3$.

18. The elastic wave filter device according to claim 1, wherein a close contact layer is provided between the high acoustic velocity member and the piezoelectric film.

* * * * *